(12) United States Patent
Pandey et al.

(10) Patent No.: US 11,101,218 B2
(45) Date of Patent: Aug. 24, 2021

(54) INTEGRATED ASSEMBLIES HAVING METAL-CONTAINING REGIONS COUPLED WITH SEMICONDUCTOR REGIONS

(71) Applicant: Micron Technology, Inc., Boise, ID (US)

(72) Inventors: Sumeet C. Pandey, Boise, ID (US); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 340 days.

(21) Appl. No.: 16/112,333

(22) Filed: Aug. 24, 2018

(65) Prior Publication Data

US 2020/0066637 A1   Feb. 27, 2020

(51) Int. Cl.
| | |
|---|---|
| *H01L 23/535* | (2006.01) |
| *H01L 27/108* | (2006.01) |
| *H01L 23/532* | (2006.01) |
| *H01L 29/08* | (2006.01) |

(52) U.S. Cl.
CPC ........ *H01L 23/535* (2013.01); *H01L 23/5329* (2013.01); *H01L 23/53257* (2013.01); *H01L 27/10814* (2013.01); *H01L 27/10823* (2013.01); *H01L 29/0847* (2013.01)

(58) Field of Classification Search
None
See application file for complete search history.

(56) References Cited

U.S. PATENT DOCUMENTS

| | | | |
|---|---|---|---|
| 6,882,025 B2 * | 4/2005 | Yeo | H01L 21/76229 257/374 |
| 6,936,881 B2 * | 8/2005 | Yeo | H01L 21/84 257/296 |
| 2005/0035410 A1 | 2/2005 | Yeo et al. | |
| 2006/0220087 A1 | 10/2006 | Fishburn | |

(Continued)

FOREIGN PATENT DOCUMENTS

| | | |
|---|---|---|
| WO | WO PCT/US2019/025594 | 7/2019 |
| WO | WO PCT/US2019/025594 | 3/2021 |

OTHER PUBLICATIONS

Agrawal et al., "Barrier Height Reduction to 0.15eV and Contact Resistivity Reduction to 9.1X10-9 ?-cm2 Using Ultrathin TiO2-x Interlayer between Metal and Silicon", 2013 Symposium on VLSI Technology Digest of Technical Papers, pp. T200-T201.

(Continued)

*Primary Examiner* — Bo B Jang
(74) *Attorney, Agent, or Firm* — Wells St. John P.S.

(57) ABSTRACT

Some embodiments include an integrated assembly which has a semiconductor material with a surface. A first layer is over and directly against the surface. The first layer includes oxygen and a first metal. The relative amount of oxygen to the first metal is less than or equal to an amount sufficient to form stoichiometric metal oxide throughout the first layer. A second metal is over and directly against the first layer. A second layer is over and directly against the second metal. The second layer includes nitrogen and a third metal. Some embodiments include an integrated assembly which has a semiconductor material with a surface. A metal is adjacent the surface and is spaced from the surface by a distance of less than or equal to about 10 Å. There is no metal germanide or metal silicide between the metal and the surface.

63 Claims, 4 Drawing Sheets

(56) References Cited

U.S. PATENT DOCUMENTS

| | | |
|---|---|---|
| 2007/0042596 A1 | 2/2007 | McTeer |
| 2007/0120165 A1* | 5/2007 | Matsuura .......... H01L 27/11502 |
| | | 257/296 |
| 2007/0218569 A1 | 9/2007 | Fukada et al. |
| 2010/0240189 A1 | 9/2010 | Jeong et al. |
| 2017/0162661 A1 | 6/2017 | Haverty et al. |

OTHER PUBLICATIONS

Lee et al., "Impact of Thermal Treatments on the Schottky Barrier Height Reduction at the Ti—TiOx—Si Interface for Contact Resistance Reduction", IEEE, 2014, 2 pages.

Lin et al., "Increase in current density for metal contacts to n-germanium by inserting TiO2 interfacial layer to reduce Schottky barrier height", Applied Physics Letters, 98, American Institute of Physics, 2011, 2 pages.

Yuan et al., "Schottky barrier height reduction for metal/n-GaSb contact by inserting liO2 INterfacial layer with low tunneling resistance", Applied Physics Letters, 98, American Institute of Physics, 4 pages.

Zhu et al., "Low-resistance titanium/n-type silicon (1 0 0) contacts by monolayer selenium passivation", Journal of Physics D: Applied Physics, Institute of Physics Publishing, 2007, pp. 547-550.

\* cited by examiner

INTEGRATED ASSEMBLIES HAVING METAL-CONTAINING REGIONS COUPLED WITH SEMICONDUCTOR REGIONS

TECHNICAL FIELD

Integrated assemblies having metal-containing regions coupled with semiconductor regions; such as, for example, assemblies having transistors with source/drain regions coupled with metal-containing regions.

BACKGROUND

Integrated assemblies often comprise electrical contact from metal to semiconductor material. Unfortunately, problematic resistance may be encountered along interfaces between metal and semiconductor material. If such resistance (referred to herein as "contact resistance") is too high, such may lead to undesired operational characteristics; including, for example, one or more of undesired heating, excessive power demands, slow device response, etc. Accordingly, it is desired to develop configurations which reduce contact resistance.

DETAILED DESCRIPTION OF THE ILLUSTRATED EMBODIMENTS

Some embodiments include configurations in which an interface between a semiconductor material (e.g., silicon, germanium, SiGe) and a metal is kept very clean in order to reduce contact resistance between the semiconductor material and the metal. One aspect of maintaining a clean interface may be to avoid any formation of metal silicide and/or metal germanide along such interface. In some embodiments, the metal may be formed directly against the semiconductor material while avoiding metal silicide and/or metal germanide formation between the metal and the semiconductor material. In some embodiments, a thin layer of metal oxide may be provided between the metal and the semiconductor material; with the metal oxide precluding formation of metal silicide and/or metal germanide which may otherwise form along the interface between the metal and the semiconductor material. In some embodiments, one or both of selenium (Se) and tellurium (Te) may be incorporated within a region of the metal proximate an interface to improve structural properties along the interface. In some embodiments, such improvement may further reduce contact resistance. In some embodiments, multiple compositions may be provided over semiconductor material to achieve desired low resistance contact with the semiconductor material. Such compositions may be chosen to enable a clean interface along an upper surface of the semiconductor material and/or may be chosen to yield matching of transverse electron momentum across metal-containing materials and the semiconductor material. Example embodiments are described with reference to FIGS. 1-15.

Figure 1:
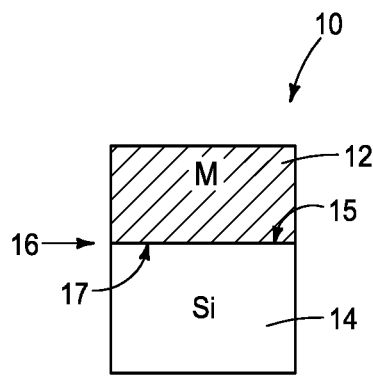
FIGS. 1 and 2 are diagrammatic cross-sectional side views of regions of example integrated assemblies.

Referring to FIG. 1, an assembly 10 is shown to comprise metal-containing material 12 over semiconductor material 14. The metal-containing material 12 is labeled "M" to indicate that it comprises metal, and the semiconductor material 14 is labeled Si to indicate that silicon is an example semiconductor material which may be utilized within semiconductor material 14. However, it is to be understood that the semiconductor material 14 may additionally, or alternatively, include other semiconductor materials besides silicon. For instance, the semiconductor material may include Ge or SiGe (where the formula "SiGe" lists primary constituents, and is not intended to indicate any particular stoichiometry). It is to be understood that the semiconductor material 14 may comprise any suitable composition(s); and in some embodiments may comprise, consist essentially of, or consist of one or more of silicon, germanium, III/V semiconductor material (e.g., gallium phosphide), semiconductor oxide, etc.; with the term III/V semiconductor material referring to semiconductor materials comprising elements selected from groups III and V of the periodic table (with groups III and V being old nomenclature, and now being referred to as groups 13 and 15).

The metal-containing material 12 has a lower surface 17 adjacent and directly against an upper surface 15 of the semiconductor material 14. The region where the surface 17 of metal-containing material 12 joins to the surface 15 of semiconductor material 14 may be referred to as an interface 16. A region of the metal-containing material 12 along the interface 16 may be referred to as an interfacial region of the metal-containing material, and a region of the semiconductor material 14 along the interface 16 may be referred to as an interfacial region of the semiconductor material.

The metal-containing material 12 may be a single metal, or a mixture (e.g., alloy) of two or more different metals. In some embodiments, the metal-containing material 12 may comprise, consist essentially of, or consist of one or more metals selected from the group consisting of titanium (Ti), magnesium (Mg), zirconium (Zr), hafnium (Hf) and nickel (Ni).

In some embodiments, the semiconductor material 14 may be considered to be part of a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above.

In some embodiments, the semiconductor material 14 may be conductively-doped. For instance, the semiconductor material 14 may comprise, consist essentially of, or consist of silicon (or Ge, or SiGe) doped to a concentration of at least about $1 \times 10^{20}$ atoms/cm$^3$ with conductivity-enhancing dopant (e.g., phosphorus (P), boron (B), arsenic (As), etc.). However, some aspects of the invention described herein include recognition that problems encountered in fabricating integrated circuits to ever-increasing levels of integration may include increasing difficulty in providing dopant within semiconductor material, and in adequately activating such dopant in order to form conductive regions within the semiconductor material. In some embodiments, the semiconductor material 14 may be very lightly doped (e.g., may comprise, consist essentially of, or consist of silicon (or Ge, or SiGe) doped to a concentration of no greater than about $1 \times 10^{15}$ atoms/cm$^3$ with conductivity-enhancing dopant), or may even be effectively undoped (e.g., may comprise, consist essentially of, or consist of silicon (or Ge, or SiGe) doped to a concentration of no greater than about $1 \times 10^{12}$ atoms/cm$^3$ with conductivity-enhancing dopant), and yet adequate conductivity may be achieved through such semiconductor material by virtue of very low contact resistance across the interface 16.

The interface 16 between the metal-containing material 12 and the semiconductor material 14 is very clean; and specifically no secondary materials (e.g., metal silicides or metal germanides) are generated along such interface. Such is in contrast to conventional structures, in which metal silicides often form when metal directly contacts silicon, and in which metal germanides often form when metal directly contacts germanium. The clean interface may be achieved utilizing any suitable methodology. For instance, in some embodiments the metal may comprise titanium formed utilizing atomic layer deposition (ALD) with water and one or more of titanium tetrachloride (TiCl$_4$), titanium isopropoxide (Ti(OCH(CH$_3$)$_2$)$_4$) and titanium(isopropoxide)$_2$(dimethylaminoethanolate)$_2$. The ALD may be conducted at a temperature of from about 100° C. to about 400° C.

It may be difficult to keep interface 16 entirely clean of metal silicide in embodiments in which the semiconductor material 14 comprises silicon and the metal 12 is formed directly against such silicon. For instance, thermal conditions during or after formation of the metal 12 may lead to undesired formation of metal silicide along the interface 16. Analogously, thermal conditions may lead to undesired formation of metal germanide along the interface 16 in embodiments in which the semiconductor material 14 comprises germanium and the metal 12 is formed directly against the germanium.

Figure 2:
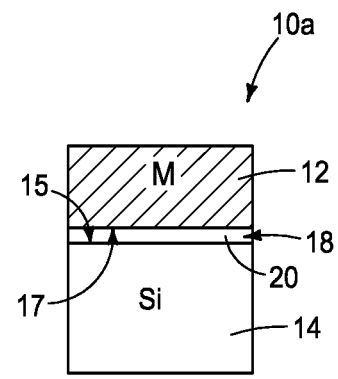

In some applications, it may be desirable to form a barrier between the semiconductor material 14 and the metal-containing material 12. FIG. 2 shows a region of an example integrated assembly 10a in which a layer 18 is provided between the metal-containing material 12 and the semiconductor material 14. The layer 18 is over and directly against the surface 15 of the semiconductor material 12. In some embodiments, the layer 18 may have a thickness within a range of from about one monolayer to less than or equal to about 10 angstroms (Å); in some embodiments within a range of from about 5 Å to about 10 Å; and in some embodiments within a range of from about 4 Å to about 7 Å.

The layer 18 may comprise any suitable composition 20. In some embodiments, the composition 20 may include oxygen and a metal; with the relative amount of oxygen to the metal being less than or equal to an amount sufficient to form stoichiometric metal oxide throughout the layer 18. For instance, the metal within layer 18 may be titanium, the stoichiometric metal oxide may be titanium oxide (TiO$_2$), and the amount of oxygen within the layer 18 may be such that the composition 20 has a formula TiO$_x$, (where "x" is a number within a range of from greater than 0 to less than or equal to 2).

The layer 18 is kept thin enough so that insulative properties of layer 18 do not substantially increase resistance between metal-containing material 12 and semiconductor material 14. Further, if the oxygen content within layer 18 is kept less than a stoichiometric amount of oxygen, such may reduce insulative properties of the layer 18 (as compared to embodiments in which the oxygen content is a stoichiometric amount of oxygen), which may also alleviate undesired increase in resistance between the metal-containing material 12 and the semiconductor material 14.

The composition 20 of layer 18 may be any suitable composition which enables a clean interface to be maintained along the upper surface 15 of semiconductor material 14 and along the lower surface 17 of metal-containing material 12. In some embodiments, the composition 20 may comprise, consist essentially of, or consist of one or more of AlO, TaO, TiO, and SrTiO; where the chemical formulas indicate principle constituents rather than specific stoichiometries. In some embodiments, AlO, TaO, TiO, and SrTiO may be instead referred to as AlO$_x$, TaO$_x$, TiO$_x$, and SrTiO$_x$.

In some embodiments, the composition 20 of layer 18 may be considered to comprise a first metal, and the metal-containing material 12 may be considered to comprise a second metal. The first and second metals may be the same as one another in some embodiments, or may be different from one another in other embodiments. In some example embodiments, the first and second metals may both comprise titanium; with the metal-containing material 12 consisting of titanium, and the layer 18 comprising TiO (where the chemical formula indicates principle constituents rather than a specific stoichiometry).

In some embodiments, the assemblies 10 and 10a of FIGS. 1 and 2 may be considered to illustrate example embodiments in which a metal-containing material 12 is over a surface 15 of a semiconductor material 14, and is spaced from such surface by a distance of less than or equal to about 10 Å; with there being no detectable metal silicide or metal germanide between the metal-containing material 12 and the surface 15.

Figure 3:
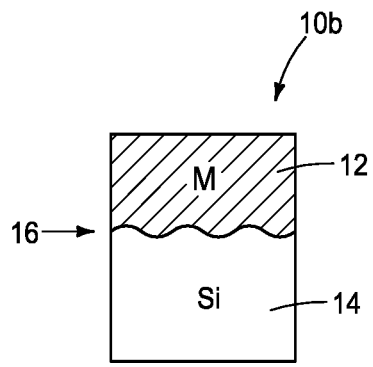
FIG. 3 is a diagrammatic cross-sectional side view of a region of an example integrated assembly showing a potential problem.

A problem that may occur during formation of metal-containing material (e.g., metal-containing material 12 of FIGS. 1 and 2) is that the metal-containing material may deposit unevenly across an underlying surface. FIG. 3 shows an integrated assembly 10b analogous to the integrated assembly 10 of FIG. 1, but showing an example in which there is undulation across the interface 16 due to uneven deposition of metal-containing material 12. The undulation may lead to some regions along the interface having lower resistance than others, which may alter performance across the interface 16 as compared to configurations having less undulation (and preferably no measurable undulation). Integrated circuit fabrication frequently involves forming multiple contacts which are intended to be substantially identical to one another in physical properties and performance. The undulation along the interface 16 may render it difficult to achieve uniform performance across numerous assemblies. Accordingly, it would be desirable to reduce, or even eliminate, such undulation.

Figure 4:
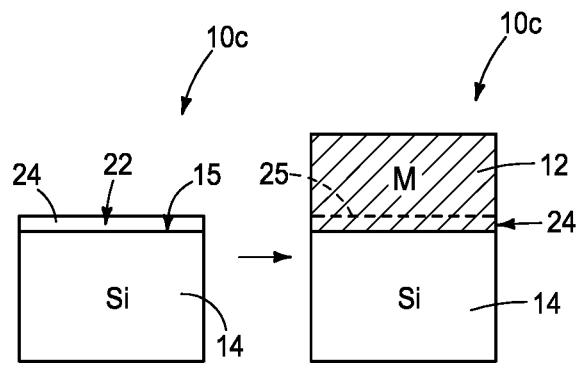
FIG. 4 shows diagrammatic cross-sectional side views of an integrated assembly at process stages which may alleviate the potential problem shown in FIG. 3.

FIG. 4 illustrates an example method which may be used to reduce, or even eliminate, the undulation described above with reference to FIG. 3. Specifically, an integrated assembly 10c on the left side of FIG. 4 comprises the semiconductor material 14, and a layer 22 over the upper surface 15 of the semiconductor material. The layer 22 may comprise, consist essentially of, or consist of one or both of selenium (Se) and tellurium (Te). The layer 22 may be formed to any suitable thickness. In some embodiments, the layer 22 may be discontinuous across the upper surface 15 of the semiconductor material 14. In other embodiments, the layer 22 may be continuous. If the layer 22 is continuous, such may have any suitable thickness; and in some embodiments may have a thickness within a range of from about one monolayer to about 10 Å. In some embodiments, the Se and/or Te within layer 22 may be in an amorphous form.

In some embodiments, the layer 22 may be considered to comprise a composition 24 comprising passivating material; with such passivating material comprising one or both of Se and Te. The passivating material 22 improves the uniformity of the deposition of metal-containing material 12, as shown in a configuration on the right side of FIG. 4. In some embodiments, the Se and/Te of the passivating material may remain within an interfacial region 24 along the bottom of the metal-containing material 12.

A boundary between metal-containing material 12 and the interfacial region 24 is diagrammatically illustrated with a dashed line 25 to indicate that there may be some mixing of metal from metal-containing material 12 with the Se and/or Te within the interfacial region 24; and accordingly there may not be a clearly defined boundary. Alternatively, there may be a clearly defined boundary between the metal-containing material 12 and the interfacial region 24.

In some embodiments, the interfacial region 24 may comprise a discontinuous layer; with such discontinuous layer including one or both of Se and Te. In some embodiments, the interfacial region 24 may comprise a continuous layer which includes one or both of Se and Te. Such continuous layer may have any suitable thickness; such as, for example, a thickness within a range of from about one monolayer to about 10 Å.

Figure 5:
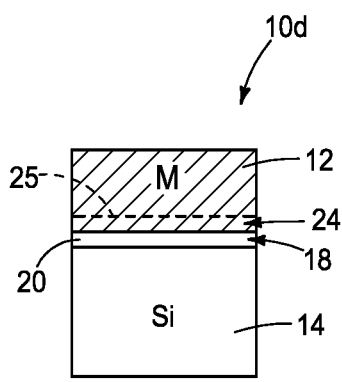
FIGS. 5-11 are diagrammatic cross-sectional side views of regions of example integrated assemblies.

The embodiment of FIG. 4 shows the metal-containing material 12 and the interfacial region 24 formed directly over the semiconductor material 14. In other embodiments, the Se and/or Te of the interfacial region 24 may be utilized to improve deposition of the metal-containing material 12 along an oxide-containing layer 18 analogous to the layer described above with reference to FIG. 2. For instance, FIG. 5 shows an integrated assembly 10d analogous to the assembly 10a of FIG. 2, but comprising the interfacial region 24 between the metal-containing material 12 and the oxide of layer 18.

The conductive configurations described herein may provide numerous advantages relative to conventional configurations utilized for providing contact to semiconductor materials. The conductive configurations described herein may have desired low resistance, may have good match of transverse electron momentum throughout the various stacked materials, and may have desired stability to relatively high temperatures (for instance, temperatures greater than or equal to about 500° C.).

The structures described above with reference to FIGS. 1-5 may be incorporated into integrated circuitry to form low-resistance contacts to semiconductor material. FIGS. 6-11 illustrating example embodiments comprising low-resistance contacts incorporating configurations of the types described above with reference to FIGS. 1-5. In some embodiments, the conductive contacts may be considered to be representative of a field of suitable contacts; with such field including, for example, cell contacts, digit line contacts, periphery contacts, etc.

Figure 6:
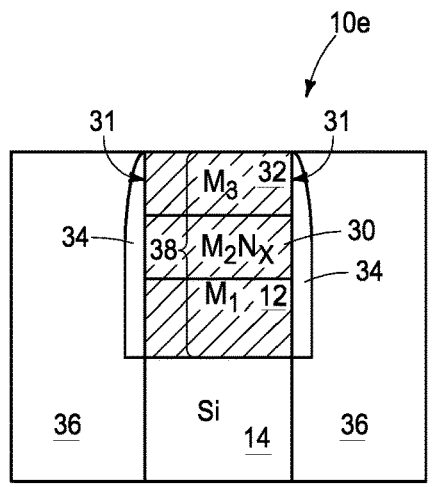

Referring to FIG. 6, an integrated assembly 10e includes semiconductor material 14, the metal-containing material 12 over and directly against the semiconductor material 14, another metal-containing material 30 over and directly against the metal-containing material 12, and another metal-containing material 32 over and directly against the metal-containing material 30.

The metals within materials 12, 30 and 32 are labeled as $M_1$, $M_2$ and $M_3$, respectively. Such metals may be the same as one another in some embodiments; and in other embodiments at least one of the metals may be different than at least one other of the metals. In example embodiments, the metals $M_1$, $M_2$ and $M_3$ may all be selected from the group consisting of Ti, Mg, Zr, Hf and Ni. In some embodiments, the metals $M_1$, $M_2$ and $M_3$ may all be Ti.

The metal-containing composition 30 includes the second metal $M_2$ in combination with nitrogen; and is shown with the formula $M_2N_x$. The label x may correspond to a number greater than zero. In some embodiments, the metal-containing composition 30 comprises metal nitride with a stoichiometric amount of nitrogen. In other embodiments, there may be less than a stoichiometric amount of nitrogen in such metal nitride.

The metal nitride of the metal-containing composition 30 is an example of an electrically conductive material which may be formed over the metal-containing composition 12 and utilized to achieve good electrical contact with the metal-containing composition 12. In some embodiments, the composition 30 may comprise a metal-containing composition which includes other non-metals either alternatively to, or in addition to, nitrogen. For instance, the metal-containing composition 30 may comprise metal carbide alternatively to, or in addition to, metal nitride.

The metal-containing material 32 may comprise, consist essentially of, or consist of the third metal $M_3$. In some example embodiments, the metal-containing material 32 may comprise, consist essentially of, or consist of metal which is resistant to oxidation; such as, for example, tungsten.

The metal-containing compositions 12, 30 and 32 together form a stack having sidewall surfaces 31. Regions of the sidewall surfaces 31 along the metal-containing compositions 12 and 30 may be susceptible to oxidation if oxygen diffuses from neighboring materials into such sidewall surfaces. Accordingly, oxygen-barrier material 34 is formed along the sidewall surfaces 31. In the illustrated embodiment, the oxygen-barrier material 34 also extends along the sidewall surfaces of the metal-containing composition 32. Such may be desired if sidewall surfaces of the metal-containing composition 32 are also susceptible to oxidation; or may be desirable in order to simplify processing. However, it is to be understood that in some embodiments the oxygen-barrier material 34 may be provided only along the sidewall surfaces of metal-containing compositions 12 and 30, and not along the sidewall surfaces of the composition 32 if composition 32 has suitable resistance to oxidation.

The oxygen-barrier material 34 may comprise any suitable composition; and in some embodiments may comprise, consist essentially of, or consist of silicon nitride. In the shown embodiment, the oxygen-barrier material 34 is directly against sidewall surfaces of the metal-containing compositions 12, 30 and 32. In other embodiments, the oxygen-barrier material 34 may be spaced from such sidewall surfaces by one or more intervening materials (as described in more detail below with reference to FIGS. 10 and 11).

In the shown embodiment, oxygen-containing material 36 is along the oxygen-barrier material 34, and is spaced from the sidewalls of metal-containing compositions 12, 30 and 32 by the oxygen-barrier material 34. The oxygen-containing material 36 may comprise any suitable composition or combination of compositions; and in some embodiments may comprise, consist essentially of, or consist of silicon dioxide.

The metal-containing materials 12, 30 and 32 together form a conductive stack 38 which is over the semiconductor material 14. Such conductive stack may be utilized to achieve good electrical coupling between components over the stack (example components are described below with reference to FIG. 12) and the semiconductor material 14. The electrical coupling to the semiconductor material 14 may have low resistance due to the clean interface 16 between the metal-containing composition 12 and the semiconductor material 14. The metal-containing material 30 is chosen to have low-resistance electrical coupling with the metal-containing composition 12 and good adhesion to the composition 12. The metal-containing composition 32 is chosen to have low-resistance electrical coupling with the composition 30, good adhesion to the composition 30, and possibly also resistance to oxidation.

The stack 38 may have any suitable configuration when viewed from above. For instance, the stack may appear to be circular, elliptical, polygonal, etc.; and the barrier 34 may form a ring which extends entirely around the stack when viewed from above.

Figure 7:
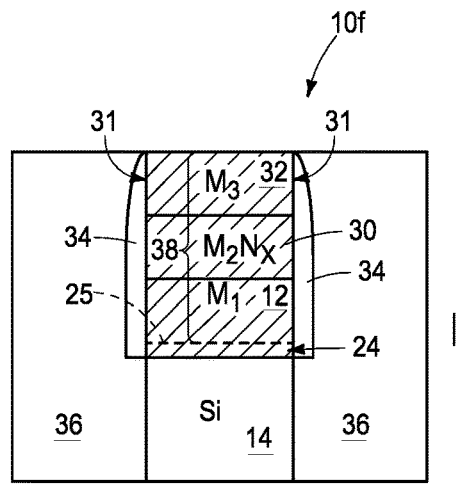

The integrated assembly 10e of FIG. 6 is based on the configuration described above with reference to FIG. 1. Analogous integrated assemblies may be based on the configurations of FIGS. 2, 4 and 5. For instance, FIG. 7 shows an integrated assembly 10f analogous to the assembly 10e of FIG. 6, but based on the configuration of FIG. 4. Accordingly, the integrated assembly 10f includes the interfacial region 24 described above with reference to FIG. 4.

Figure 8:
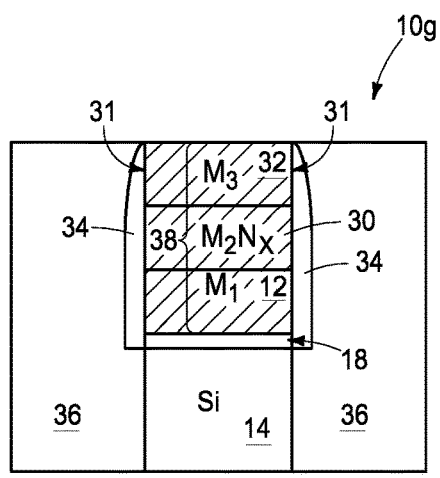

As another example, FIG. 8 shows an integrated assembly 10g analogous to the assembly 10e of FIG. 6, but based on the configuration of FIG. 2. Accordingly, the integrated assembly 10g includes the metal-oxide-containing layer 18 described above with reference to FIG. 2. In some embodiments, the configuration of FIG. 8 may be considered to comprise the metal-oxide-containing layer 18 as a first layer beneath the metal-containing composition 12, and to comprise the metal-containing composition 30 as a second layer over the metal-containing composition 12.

Figure 9:
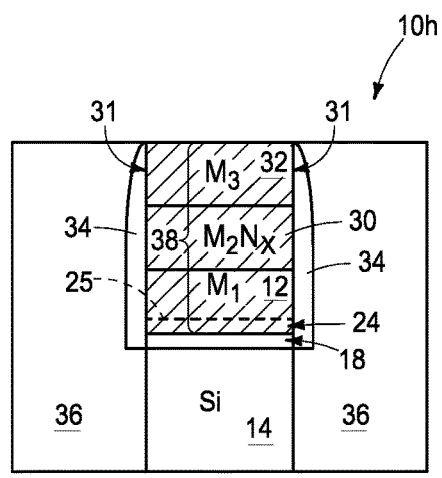

As yet another example, FIG. 9 shows an integrated assembly 10h analogous to the assembly 10e of FIG. 6, but based on the configuration of FIG. 5. Accordingly, the integrated assembly 10h includes both the metal-oxide-containing layer 18 and the interfacial region 24.

Figure 10:
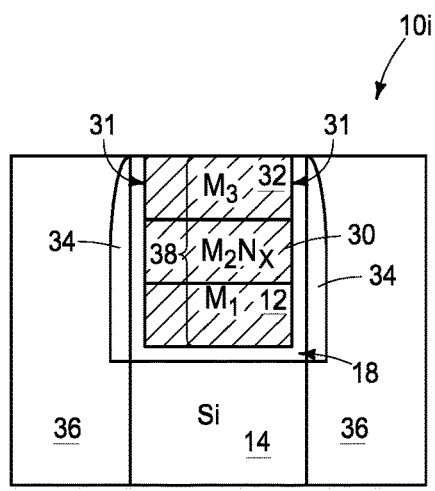
Figure 11:
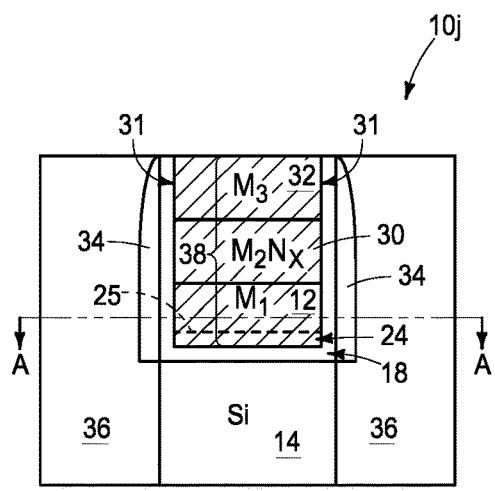

The configurations of FIGS. 8 and 9 show the metal-oxide-containing layer 18 in a planar configuration beneath the metal-containing composition 12. In other embodiments, the layer 18 may be configured in an upwardly-opening container-shaped configuration as shown in FIGS. 10 and 11. FIG. 10 shows an integrated assembly 10i analogous to the assembly 10g of FIG. 8, but comprising the layer 18 in a container-shaped configuration; and FIG. 11 shows an integrated assembly 10j analogous to the assembly 10h of FIG. 9, but comprising the layer 18 in a container-shaped configuration.

In the configurations of FIGS. 10 and 11, the oxygen-barrier material 34 is spaced from the sidewalls 31 of stacks 38 by regions of the layer 18.

Figure 11A:
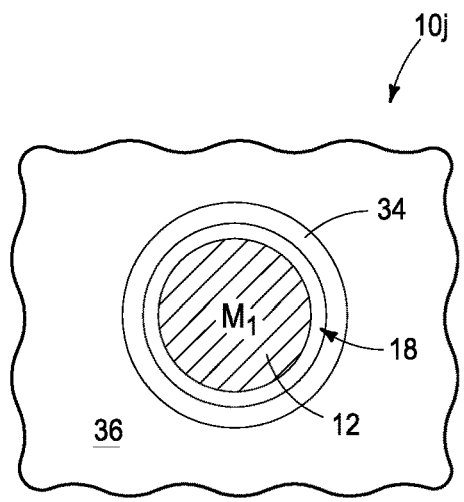
FIG. 11A is a diagrammatic cross-sectional downward view along the line A-A of FIG. 11.

FIG. 11A shows a top-down view along the line A-A of FIG. 11, and shows the oxygen-barrier material 34 configured as a ring surrounding the metal-containing composition 12. In the shown embodiment, the metal-containing composition 12 is configured in a circular configuration in the top-down view of FIG. 11A. In other embodiments, the metal-containing composition 12 may have other configurations in analogous top-down views; such as, for example, an elliptical configuration, a polygonal configuration, etc.

Figure 12:
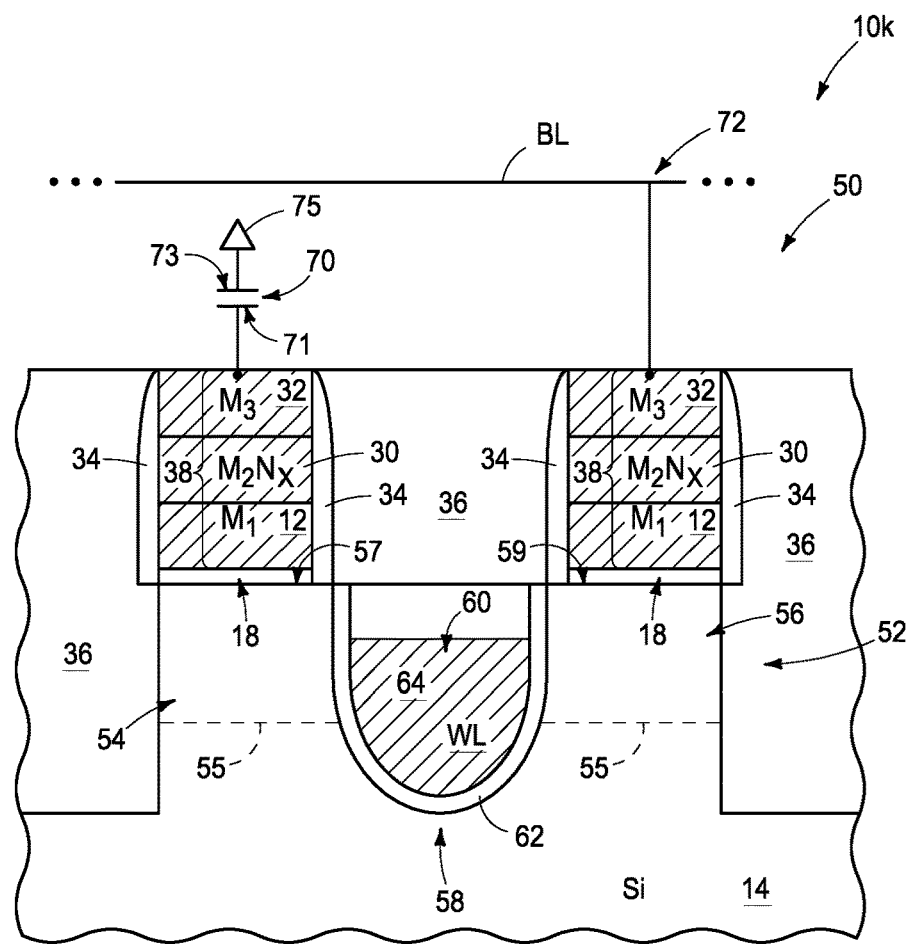
FIG. 12 is a diagrammatic cross-sectional side view of a region of an example integrated assembly comprising an example DRAM cell.

The configurations described above with reference to FIGS. 1, 2 and 4-11 may be incorporated into integrated circuitry to enable low-resistance contact with semiconductor regions. For instance, FIG. 12 shows an integrated assembly 10k comprising an example memory cell 50 of a DRAM (dynamic random-access memory) array.

The memory cell 50 includes a transistor 52 having a pair of source/drain regions 54 and 56 which extend into the semiconductor material 14. Approximate lower boundaries of the source/drain regions 54 and 56 are indicated with dashed-lines 55. The source/drain regions may have appropriate conductivity-enhancing dopant provided therein to an appropriate concentration. In some example embodiments, the source/drain regions 54 and 56 may be conductively-doped; and accordingly may be doped to a concentration of at least about $1 \times 10^{20}$ atoms/cm$^3$ with conductivity-enhancing dopant. In some embodiments, it may be found that the conductive interconnects described herein provide adequate conductive contact to offset deficiencies in conductivity within the source/drain regions 54 and 56; and accordingly the source/drain regions may comprise less dopant than is conventional utilized to provide adequate conductivity. In some embodiments, one or both of the source/drain regions 54 and 56 may be very lightly doped (e.g., may comprise, consist essentially of, or consist of silicon (or Ge, or SiGe) doped to a concentration of no greater than about $1 \times 10^{15}$ atoms/cm$^3$ with conductivity-enhancing dopant), or may even be effectively undoped (e.g., may comprise, consist essentially of, or consist of silicon (or Ge, or SiGe) doped to a concentration of no greater than about $1 \times 10^{12}$ atoms/cm$^3$ with conductivity-enhancing dopant).

The source/drain region 54 may be considered to be a first source/drain region, and to comprise a first upper surface 57; and the source/drain region 56 may be considered to be a second source/drain region, and to comprise a second upper surface 59.

A channel region 58 extends into the semiconductor material 14, and extends between the source/drain regions 54 and 56.

A transistor gate 60 is adjacent the channel region 58, and is spaced from the channel region by dielectric material 62. The dielectric material 62 may comprise any suitable composition or combination of compositions; and in some embodiments may comprise, consist essentially of, or consist of silicon dioxide. The dielectric material 62 may be referred to as gate dielectric material.

The transistor gate 60 comprises an electrically conductive material 64. Such electrically conductive material may comprise any suitable electrically conductive composition(s), such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). The gate 60 is part of a wordline (WL) which extends in and out of the page relative to the cross-sectional view of FIG. 12.

A first region of a metal-oxide-containing layer 18 is over the first surface 57 of the first source/drain region 54, and a second region of the metal-oxide-containing layer 18 is over the second surface 59 of the second source/drain region 56. A first conductive stack 38 of metal-containing compositions 12, 30 and 32 is over the first source/drain region 54, and a second stack 38 of the metal-containing compositions 12, 30 and 32 is over the second source/drain region 56.

In the shown embodiment, a first electrical component 70 is electrically coupled with the first source/drain region 54 through the layer 18 and the stack 38 over such first source/drain region; and a second electrical component 72 is electrically coupled with the second source/drain region 56 through the layer 18 and the stack 38 over such second source/drain region.

The first electrical component 70 corresponds to a capacitor; with such capacitor having a first plate 71 and a second plate 73. The second plate 73 is electrically coupled with ground 75 (or other suitable reference voltage). The capacitor is drawn schematically, and may have any suitable configuration either now known or yet to be developed. The capacitor may comprise non-ferroelectric insulative material between the plates 71 and 73; and/or may comprise ferroelectric material between the plates 71 and 73.

The second electrical component 72 corresponds to a bitline (BL). The bitline may extend orthogonally relative to the wordline WL; and in the shown embodiment extends along the cross-section of FIG. 12. In operation, the memory cell 50 may be one of a large number of substantially identical memory cells within a memory array (with the term "substantially identical" meaning identical to within reasonable tolerances of fabrication and measurement); and each memory cell may be uniquely addressed through a combination of a bitline and a wordline.

The illustrated embodiment of FIG. 12 utilizes conductive stacks 38 and underlying layers 18 in a configuration analogous to that described above with reference to FIG. 8. In other embodiments, other configurations may be utilized; such as, for example, any of the configurations described above with reference to FIGS. 6, 7 and 9-11.

Although the embodiment of FIG. 12 shows each of the electrical components 75 and 72 coupled to an underlying source/drain region (54 or 56) through an identical conductive stack 38, in other embodiments (not shown) one of the conductive stacks may be different than the other; and in some embodiments one of the conductive stacks may be omitted if it is found that adequate contact may be made to one of the source/drain regions without such conductive stack.

The capacitor 70 of FIG. 12 is an example of a charge-storage device. In other embodiments, alternative charge-storage devices may be utilized instead of the capacitor 70.

Figure 13:
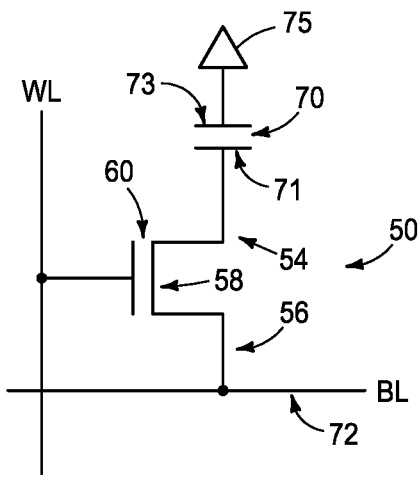
FIG. 13 is a schematic illustration of an example DRAM cell.

FIG. 13 schematically illustrates the memory cell 50 of FIG. 12; and shows the memory cell 50 being uniquely addressed through the combination of the wordline (access line) WL and the bitline (digit line, sense line) BL.

Figure 14:
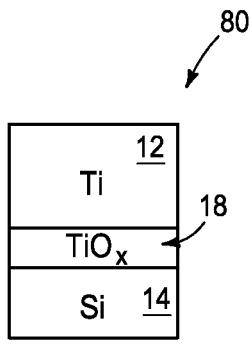
FIG. 14 is a diagrammatic cross-sectional side view of a region of an example integrated assembly.

The configurations and structures described above may be formed with any suitable processing. FIG. 14 shows an example configuration 80 in which the semiconductor material 14 comprises silicon, the metal-containing composition 12 comprises titanium, and the layer 18 comprises $TiO_x$; where x is greater than zero and less than or equal to 2. Such configuration may be formed by, for example, deposition of the layer 18 onto a surface of the semiconductor material 14, and subsequent deposition of the metal-containing material 12 onto the layer 18. However, it may be desired that the $TiO_x$ of layer 18 comprise less than a stoichiometric amount of oxygen (i.e., that x be less than 2); and it may be difficult to form the desired composition of $TiO_x$ by conventional deposition processes. Alternatively, the semiconductor material 14 may comprise Ge or SiGe.

Figure 15:
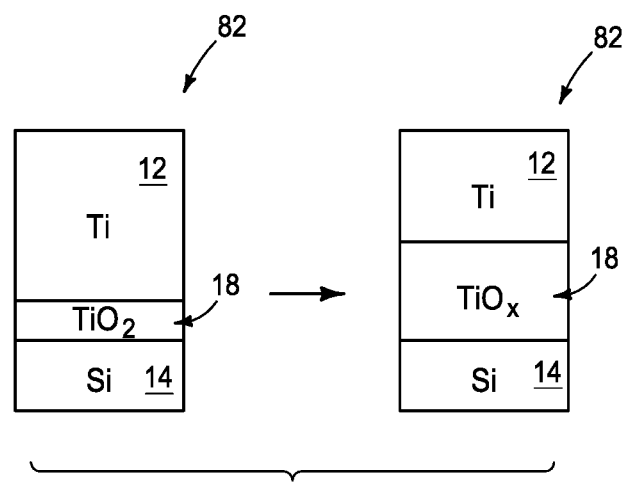
FIG. 15 shows diagrammatic cross-sectional side views of a construction at example process stages which may be utilized to fabricate an example integrated assembly.

FIG. 15 shows a process which may be suitable to form the desired $TiO_x$. Specifically, at an initial process stage of FIG. 15 (shown on the left of the figure), a configuration 82 is formed to comprise layer 18 as $TiO_2$. Such layer may be deposited utilizing any suitable methods; including, for example, atomic layer deposition. Subsequently, the configuration 82 is subjected to suitable treatment (for instance, a thermal treatment) which causes oxygen to diffuse from layer 18 into some of the metal-containing composition 12. Such expands layer 18 and alters the composition to reduce the amount of oxygen relative to titanium and to thereby create the desired $TiO_x$, with x being less than 2. The starting thickness of layer 18 may be kept very thin so that a final thickness of the layer is less than or equal to about 10 Å.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated assembly which has a semiconductor material with a surface. A first metal is adjacent the surface and is spaced from the surface by a distance of less than or equal to about 10 Å. There is no metal silicide or metal germanide between the first metal and the surface. A metal-containing composition is adjacent and directly against the first metal. The metal-containing composition includes a second metal in combination with a non-metal.

Some embodiments include an integrated assembly which has a semiconductor material with a surface. A first layer is over and directly against the surface. The first layer has a thickness within a range of from at least about one monolayer to less than or equal to about 10 Å. The first layer includes oxygen and a first metal. The relative amount of oxygen to the first metal is less than or equal to an amount sufficient to form stoichiometric metal oxide throughout the first layer. A second metal is over and directly against the first layer. A second layer is over and directly against the second metal. The second layer includes nitrogen and a third metal.

Some embodiments include an integrated assembly having a pair of source/drain regions extending into a semiconductor material. The source/drain regions are a first source/drain region and a second source/drain region. The first source/drain region has a first surface, and the second source/drain region has a second surface. A channel region is within the semiconductor material and between the first and second source/drain regions. A gate is adjacent the channel region. Dielectric material is between the gate and the channel region. A first layer is over and directly against the first surface. The first layer has a thickness within a range of from at least about one monolayer to less than or equal to about 10 Å. The first layer comprises oxygen and a first metal. The relative amount of oxygen to the first metal is less than or equal to an amount sufficient to form stoichiometric metal oxide throughout the first layer. A second metal is over and directly against the first layer. A second layer is over and directly against the second metal. The second layer comprises nitrogen and a third metal. An electrical component is electrically coupled to the first source/drain region through the second layer and the second metal.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. An integrated assembly, comprising:
    a semiconductor material having a surface, the semiconductor material comprising one or both of silicon and germanium;
    a first metal adjacent the surface and spaced from the surface by a distance of less than or equal to about 10 Å; there being no metal silicide or metal germanide between the first metal and the surface;
    a metal-containing composition adjacent and directly against the first metal; the metal-containing composition including a second metal in combination with a non-metal; and
    wherein the first metal is selected from the group consisting of Mg, Zr and Ni.

2. The integrated assembly of claim 1 wherein the semiconductor material is doped to a concentration of at least about $1 \times 10^{20}$ atoms/cm$^3$ with conductivity-enhancing dopant.

3. The integrated assembly of claim 1 wherein the semiconductor material is doped to a concentration of no greater than about $1 \times 10^{15}$ atoms/cm$^3$ with conductivity-enhancing dopant.

4. The integrated assembly of claim 1 wherein the semiconductor material is doped to a concentration of no greater than about $1 \times 10^{12}$ atoms/cm$^3$ with conductivity-enhancing dopant.

5. The integrated assembly of claim 1 comprising oxygen-barrier material adjacent the first metal, and comprising silicon dioxide on an opposing side of the oxygen-barrier material from the first metal.

6. The integrated assembly of claim 5 wherein the oxygen-barrier material comprises silicon nitride.

7. The integrated assembly of claim 6 wherein the oxygen-barrier material is directly against the first metal.

8. The integrated assembly of claim 6 wherein the oxygen-barrier material is spaced from the first metal by a metal oxide.

9. The integrated assembly of claim 1 wherein the metal-containing composition comprises a metal nitride.

10. The integrated assembly of claim 1 wherein the second metal is selected from the group consisting of Ti, Mg, Zr, Hf and Ni.

11. The integrated assembly of claim 10 wherein the first and second metals are different metals relative to one another.

12. The integrated assembly of claim 10 wherein the first and second metals are a same metal as one another.

13. The integrated assembly of claim 1 wherein the metal-containing composition comprises titanium nitride.

14. The integrated assembly of claim 1 comprising a layer between the surface and the first metal; the layer containing oxygen and a third metal.

15. The integrated assembly of claim 14 wherein the layer comprises one or more of AlO, TaO, TiO, and SrTiO; where the chemical formulas indicate principle constituents rather than specific stoichiometries.

16. The integrated assembly of claim 14 wherein the first and third metals are a same metal as one another.

17. The integrated assembly of claim 1 comprising an interfacial region between the first metal and the surface; the interfacial region including one or both of Se and Te.

18. The integrated assembly of claim 17 wherein the interfacial region includes a discontinuous layer along the first metal; with the discontinuous layer including said one or both of Se and Te.

19. The integrated assembly of claim 17 wherein the interfacial region includes a continuous layer along the first metal; with the layer including said one or both of Se and Te.

20. The integrated assembly of claim 1 wherein the semiconductor material comprises both of silicon and germanium.

21. An integrated assembly, comprising:
    a semiconductor material having a surface;
    a first layer over and directly against the surface; the first layer having a thickness within a range of from at least about one monolayer to less than or equal to about 10 Å; the first layer comprising oxygen and a first metal; the relative amount of oxygen to the first metal being less than an amount sufficient to form stoichiometric metal oxide throughout the first layer;
a second metal over and directly against the first layer;
a second layer over and directly against the second metal; the second layer comprising nitrogen and a third metal; and
wherein the first layer forms an upwardly-opening container-shape.

22. The integrated assembly of claim 21 wherein the second metal and the second layer are contained within the upwardly-opening container-shape.

23. The integrated assembly of claim 21 comprising an interfacial region between the second metal and first layer; the interfacial region including one or both of Se and Te.

24. The integrated assembly of claim 21 wherein the relative amount of the oxygen to the first metal within the first layer is less than an amount sufficient to form stoichiometric metal oxide throughout the first layer.

25. The integrated assembly of claim 21 wherein the first layer comprises one or more of AlO, TaO, TiO, and SrTiO; where the chemical formulas indicate principle constituents rather than specific stoichiometries.

26. The integrated assembly of claim 21 wherein the semiconductor material comprises silicon and/or germanium, and is doped to a concentration of at least about $1 \times 10^{20}$ atoms/cm$^3$ with conductivity-enhancing dopant.

27. The integrated assembly of claim 21 wherein the semiconductor material comprises silicon and/or germanium, and is doped to a concentration of no greater than about $1 \times 10^{15}$ atoms/cm$^3$ with conductivity-enhancing dopant.

28. The integrated assembly of claim 21 wherein the semiconductor material comprises silicon and/or germanium, and is doped to a concentration of no greater than about $1 \times 10^{12}$ atoms/cm$^3$ with conductivity-enhancing dopant.

29. The integrated assembly of claim 21 wherein the first, second and third metals are selected from the group consisting of Ti, Mg, Zr, Hf and Ni.

30. The integrated assembly of claim 29 wherein at least one of the first, second and third metals is a different metal relative to at least one other of the first, second and third metals.

31. The integrated assembly of claim 29 wherein the first, second and third metals are a same metal as one another.

32. The integrated assembly of claim 31 wherein the first, second and third metals are all titanium.

33. The integrated assembly of claim 21 comprising oxygen-barrier material adjacent the second metal and the second layer; and comprising silicon dioxide on an opposing side of the oxygen-barrier material from the second metal and the second layer.

34. The integrated assembly of claim 33 wherein the oxygen-barrier material comprises silicon nitride.

35. The integrated assembly of claim 34 wherein the oxygen-barrier material is directly against the second metal and the second layer.

36. The integrated assembly of claim 34 wherein the oxygen-barrier material is spaced from the second metal and the second layer by a region of the first layer.

37. An integrated assembly, comprising:
a pair of source/drain regions extending into a semiconductor material; the source/drain regions being a first source/drain region and a second source/drain region; the first source/drain region having a first surface, and the second source/drain region having a second surface;
a channel region within the semiconductor material and between the first and second source/drain regions;
a gate adjacent the channel region;
a dielectric material between the gate and the channel region;
a first layer over and directly against the first surface; the first layer having a thickness within a range of from at least about one monolayer to less than or equal to about 10 Å; the first layer comprising oxygen and a first metal; the relative amount of oxygen to the first metal being less than or equal to an amount sufficient to form stoichiometric metal oxide throughout the first layer;
a second metal over and directly against the first layer;
a second layer over and directly against the second metal; the second layer comprising nitrogen and a third metal;
an electrical component electrically coupled to the first source/drain region through the second layer and the second metal; and
an interfacial region between the second metal and first layer; the interfacial region including one or both of Se and Te; the interfacial region having a thickness of less than or equal to about 10 Å.

38. The integrated assembly of claim 37 wherein the electrical component is a charge-storage device or a digit line.

39. The integrated assembly of claim 37 wherein a region of the first layer over and directly against the first surface is a first region of the first layer; wherein a second region of the first layer is over and directly against the second surface; wherein a second region of the second metal is over and directly against the second region of the first layer; wherein a second region of the second layer is over and directly against the second region of the second metal; wherein the electrical component is a first electrical component; wherein a second electrical component is electrically coupled with the second source/drain region through the second regions of the second layer and the second metal; and wherein one of the first and second electrical components is a charge-storage device or a digit line, and the other of the first and second electrical components is the other of the charge-storage device and the digit line.

40. The integrated assembly of claim 37 wherein the first layer comprises one or more of AlO, TaO, TiO, and SrTiO; where the chemical formulas indicate principle constituents rather than specific stoichiometries.

41. The integrated assembly of claim 37 wherein the semiconductor material within the first and second source/drain regions comprises silicon and/or germanium, and is doped to a concentration of no greater than about $1 \times 10^{15}$ atoms/cm$^3$ with conductivity-enhancing dopant.

42. The integrated assembly of claim 37 wherein the semiconductor material within the first and second source/drain regions comprises silicon and/or germanium, and is doped to a concentration of no greater than about $1 \times 10^{12}$ atoms/cm$^3$ with conductivity-enhancing dopant.

43. The integrated assembly of claim 37 wherein the first, second and third metals are selected from the group consisting of Ti, Mg, Zr, Hf and Ni.

44. The integrated assembly of claim 43 wherein at least one of the first, second and third metals is a different metal relative to at least one other of the first, second and third metals.

45. The integrated assembly of claim 43 wherein the first, second and third metals are a same metal as one another.

46. The integrated assembly of claim 45 wherein the first, second and third metals are all titanium.

47. An integrated assembly, comprising:
a semiconductor material having a surface, the semiconductor material comprising one or both of silicon and germanium;
a first metal adjacent the surface and spaced from the surface by a distance of less than or equal to about 10 Å; there being no metal silicide or metal germanide between the first metal and the surface; and
a metal-containing composition adjacent and directly against the first metal; the metal-containing composition including a second metal in combination with a non-metal;
an oxygen-barrier material adjacent the first metal, and comprising silicon dioxide on an opposing side of the oxygen-barrier material from the first metal;
wherein the oxygen-barrier material comprises silicon nitride;
wherein the oxygen-barrier material is spaced from the first metal by a metal oxide.

48. An integrated assembly, comprising:
a semiconductor material having a surface, the semiconductor material comprising one or both of silicon and germanium;
a first metal adjacent the surface and spaced from the surface by a distance of less than or equal to about 10 Å; there being no metal silicide or metal germanide between the first metal and the surface;
a metal-containing composition adjacent and directly against the first metal; the metal-containing composition including a second metal in combination with a non-metal; and
an interfacial region between the first metal and the surface; the interfacial region including one or both of Se and Te.

49. The integrated assembly of claim 48 wherein the interfacial region includes a discontinuous layer along the first metal; with the discontinuous layer including said one or both of Se and Te.

50. The integrated assembly of claim 48 wherein the interfacial region includes a continuous layer along the first metal; with the layer including said one or both of Se and Te.

51. An integrated assembly, comprising:
a semiconductor material having a surface;
a first layer over and directly against the surface; the first layer having a thickness within a range of from at least about one monolayer to less than or equal to about 10 Å; the first layer comprising oxygen and a first metal; the relative amount of oxygen to the first metal being less than or equal to an amount sufficient to form stoichiometric metal oxide throughout the first layer;
a second metal over and directly against the first layer;
a second layer over and directly against the second metal; the second layer comprising nitrogen and a third metal; and
an interfacial region between the second metal and first layer;
the interfacial region including one or both of Se and Te.

52. An integrated assembly, comprising:
a semiconductor material having a surface;
a first layer over and directly against the surface; the first layer having a thickness within a range of from at least about one monolayer to less than or equal to about 10 Å; the first layer comprising oxygen and a first metal; the relative amount of oxygen to the first metal being less than or equal to an amount sufficient to form stoichiometric metal oxide throughout the first layer;
a second metal over and directly against the first layer;
a second layer over and directly against the second metal; the second layer comprising nitrogen and a third metal;
an oxygen-barrier material adjacent the second metal and the second layer; and comprising silicon dioxide on an opposing side of the oxygen-barrier material from the second metal and the second layer;
wherein the oxygen-barrier material comprises silicon nitride; and
wherein the oxygen-barrier material is spaced from the second metal and the second layer by a region of the first layer.

53. An integrated assembly, comprising:
a pair of source/drain regions extending into a semiconductor material; the source/drain regions being a first source/drain region and a second source/drain region; the first source/drain region having a first surface, and the second source/drain region having a second surface;
a channel region within the semiconductor material and between the first and second source/drain regions;
a gate adjacent the channel region;
a dielectric material between the gate and the channel region;
a first layer over and directly against the first surface; the first layer having a thickness within a range of from at least about one monolayer to less than or equal to about 10 Å; the first layer comprising oxygen and a first metal; the relative amount of oxygen to the first metal being less than or equal to an amount sufficient to form stoichiometric metal oxide throughout the first layer;
a second metal over and directly against the first layer;
a second layer over and directly against the second metal; the second layer comprising nitrogen and a third metal;
an electrical component electrically coupled to the first source/drain region through the second layer and the second metal; and
wherein a region of the first layer over and directly against the first surface is a first region of the first layer; wherein a second region of the first layer is over and directly against the second surface; wherein a second region of the second metal is over and directly against the second region of the first layer; wherein a second region of the second layer is over and directly against the second region of the second metal; wherein the electrical component is a first electrical component; wherein a second electrical component is electrically coupled with the second source/drain region through the second regions of the second layer and the second metal; and wherein one of the first and second electrical components is a charge-storage device or a digit line, and the other of the first and second electrical components is the other of the charge-storage device and the digit line.

54. An integrated assembly, comprising:
a semiconductor material having a surface, the semiconductor material comprising one or both of silicon and germanium;
a first metal adjacent the surface and spaced from the surface by a distance of less than or equal to about 10 Å; there being no metal silicide or metal germanide between the first metal and the surface;
a metal-containing composition adjacent and directly against the first metal; the metal-containing composition including a second metal in combination with a non-metal;

wherein the first metal is selected from the group consisting of Mg, Zr, Hf and Ni; and wherein the semiconductor material is doped to a concentration of no greater than about $1 \times 10^{12}$ atoms/cm$^3$ with conductivity-enhancing dopant.

55. The integrated assembly of claim 54 wherein the semiconductor material is doped to a concentration of no greater than about $1 \times 10^{15}$ atoms/cm$^3$ with conductivity-enhancing dopant.

56. An integrated assembly, comprising:
a semiconductor material having a surface, the semiconductor material comprising one or both of silicon and germanium;
a first metal adjacent the surface and spaced from the surface by a distance of less than or equal to about 10 Å; there being no metal silicide or metal germanide between the first metal and the surface;
a metal-containing composition adjacent and directly against the first metal; the metal-containing composition including a second metal in combination with a non-metal;
wherein the first metal is selected from the group consisting of Mg, Zr, Hf and Ni; and
oxygen-barrier material adjacent the first metal, and comprising silicon dioxide on an opposing side of the oxygen-barrier material from the first metal.

57. The integrated assembly of claim 56 wherein the oxygen-barrier material comprises silicon nitride.

58. The integrated assembly of claim 57 wherein the oxygen-barrier material is directly against the first metal.

59. The integrated assembly of claim 57 wherein the oxygen-barrier material is spaced from the first metal by a metal oxide.

60. An integrated assembly, comprising:
a semiconductor material having a surface, the semiconductor material comprising one or both of silicon and germanium;
a first metal adjacent the surface and spaced from the surface by a distance of less than or equal to about 10 Å; there being no metal silicide or metal germanide between the first metal and the surface;
a metal-containing composition adjacent and directly against the first metal; the metal-containing composition including a second metal in combination with a non-metal;
wherein the first metal is selected from the group consisting of Mg, Zr, Hf and Ni;
wherein the second metal is selected from the group consisting of Mg, Zr, Hf and Ni; and
wherein the first and second metals are a same metal as one another.

61. An integrated assembly, comprising:
a semiconductor material having a surface, the semiconductor material comprising one or both of silicon and germanium;
a first metal adjacent the surface and spaced from the surface by a distance of less than or equal to about 10 Å; there being no metal silicide or metal germanide between the first metal and the surface;
a metal-containing composition adjacent and directly against the first metal; the metal-containing composition including a second metal in combination with a non-metal;
wherein the first metal is selected from the group consisting of Mg, Zr, Hf and Ni; and
an interfacial region between the first metal and the surface; the interfacial region including one or both of Se and Te.

62. The integrated assembly of claim 61 wherein the interfacial region includes a discontinuous layer along the first metal; with the discontinuous layer including said one or both of Se and Te.

63. The integrated assembly of claim 61 wherein the interfacial region includes a continuous layer along the first metal; with the layer including said one or both of Se and Te.

* * * * *